United States Patent
Wu et al.

(10) Patent No.: US 11,012,074 B1
(45) Date of Patent: May 18, 2021

(54) OFF CHIP DRIVING CIRCUIT AND SIGNAL COMPENSATION METHOD

(71) Applicant: NANYA TECHNOLOGY CORPORATION, New Taipei (TW)

(72) Inventors: Chang-Ting Wu, Hsinchu County (TW); Hao-Huan Hsu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/737,880

(22) Filed: Jan. 8, 2020

(51) Int. Cl.
*H03K 19/0185* (2006.01)
*H03K 17/687* (2006.01)
*H03K 19/20* (2006.01)

(52) U.S. Cl.
CPC . *H03K 19/018585* (2013.01); *H03K 17/6872* (2013.01); *H03K 19/20* (2013.01)

(58) Field of Classification Search
CPC .......... H03K 19/0175; H03K 19/0185; H03K 19/018585; H03K 19/20; H03K 17/51; H03K 17/56; H03K 17/687; H03K 17/6871; H03K 17/6872; H03K 17/6874
See application file for complete search history.

(56) References Cited

U.S. PATENT DOCUMENTS

| | | |
|---|---|---|
| 5,602,494 A | 2/1997 | Sundstrom |
| 6,281,709 B1 | 8/2001 | Seyyedy |
| 6,573,753 B1 | 6/2003 | Snyder |
| 7,202,702 B2* | 4/2007 | Arnold ............ H03K 19/00384 326/83 |
| 2003/0112042 A1 | 6/2003 | Takahashi |
| 2005/0083766 A1* | 4/2005 | Kim .................... G11C 7/1051 365/230.05 |

* cited by examiner

*Primary Examiner* — Diana J. Cheng
(74) *Attorney, Agent, or Firm* — CRC & Partners Co., LLC

(57) ABSTRACT

An off chip driving circuit includes a decision circuit, a first compensation circuit, a second compensation circuit, a pull-up circuit and a pull-down circuit. The decision circuit is configured to output a first decision signal and a second decision signal according to a clock and an input data. The first compensation circuit is coupled to the decision circuit and configured to generate a first control signal in response to the first decision signal and the second decision signal. The second compensation circuit is coupled to the decision circuit and configured to generate a second control signal in response to the first decision signal and the second decision signal. The pull-up circuit is configured to be enabled in response to the first control signal. The pull-down circuit is configured to be enabled in response to the second control signal.

20 Claims, 13 Drawing Sheets

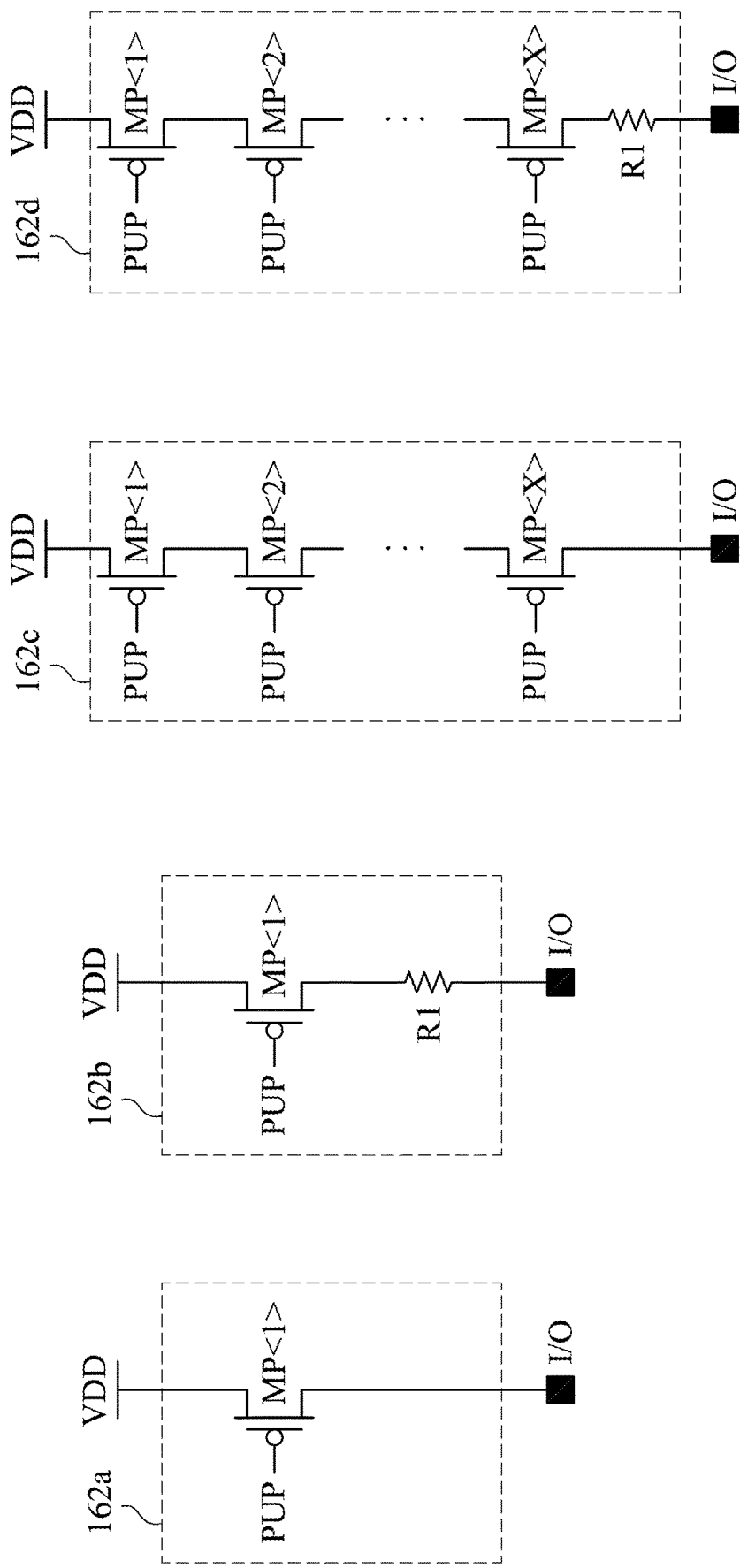

OFF CHIP DRIVING CIRCUIT AND SIGNAL COMPENSATION METHOD

BACKGROUND

Technical Field

The disclosure relates to an off chip driving circuit and a signal compensation method, particularly to an off chip driving circuit and a signal compensation method for improving signal distortion.

Description of Related Art

With development of technology, the operation speed of the memory becomes faster and faster. In high speed data transmission, the amplitude of signal is attenuated, causing signal distortion.

Therefore, how to improve signal distortion in high speed data transmission is an important issue in this field.

SUMMARY

One aspect of the present disclosure is an off chip driving circuit includes a decision circuit, a first compensation circuit, a second compensation circuit, a pull-up circuit and a pull-down circuit. The decision circuit is configured to output a first decision signal and a second decision signal according to a clock and an input data. The first compensation circuit is coupled to the decision circuit and configured to generate a first control signal in response to the first decision signal and the second decision signal. The second compensation circuit is coupled to the decision circuit and configured to generate a second control signal in response to the first decision signal and the second decision signal. The pull-up circuit is configured to be enabled in response to the first control signal. The pull-down circuit is configured to be enabled in response to the second control signal.

Another aspect of the present disclosure is a signal compensation method. The signal compensation method includes: turning a first decision signal to a high level when an input data turns from a first level to a second level; turning a second decision signal to a low level when the input data turns from the second level to the first level; generating a first control signal and a second control signal in response to the first decision signal and the second decision signal; enabling a pull-up circuit in response to the first control signal; and enabling a pull-down circuit in response to the second control signal.

In summary, in various embodiments of the present disclosure, by the adjustable enhancement circuit circuits, the slew rates of rising and dropping the control signals are able to be higher, so as to improve the slew rates of rising and dropping the output signal so that the output data of the output signal is able to be clear when the input data changes. In addition, by adjusting the numbers of the optional signals output by the OCD front-end driving circuit, the slew rate of rising and dropping the control signals can be controlled respectively to meet actual demand.

BRIEF DESCRIPTION OF THE DRAWINGS

FIGS. 2A~2D are schematic diagrams illustrating pull-up driving circuits in accordance with some embodiments of the disclosure.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the diagrams, some of the conventional structures and elements are shown with schematic illustrations.

The terms used in this specification and claims, unless otherwise stated, generally have their ordinary meanings in the art, within the context of the disclosure, and in the specific context where each term is used. Certain terms that are used to describe the disclosure are discussed below, or elsewhere in the specification, to provide additional guidance to the practitioner skilled in the art regarding the description of the disclosure.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

In this document, the term "coupled" may also be termed "electrically coupled," and the term "connected" may be termed "electrically connected." "Coupled" and "connected" may also be used to indicate that two or more elements cooperate or interact with each other. In the following description and in the claims, the terms "include" and "comprise" are used in an open-ended fashion, and thus should be interpreted to mean "include, but not limited to."

As used herein, the term "and/or" includes any and all combinations of one or more of the associated listed items.

Figure 1:
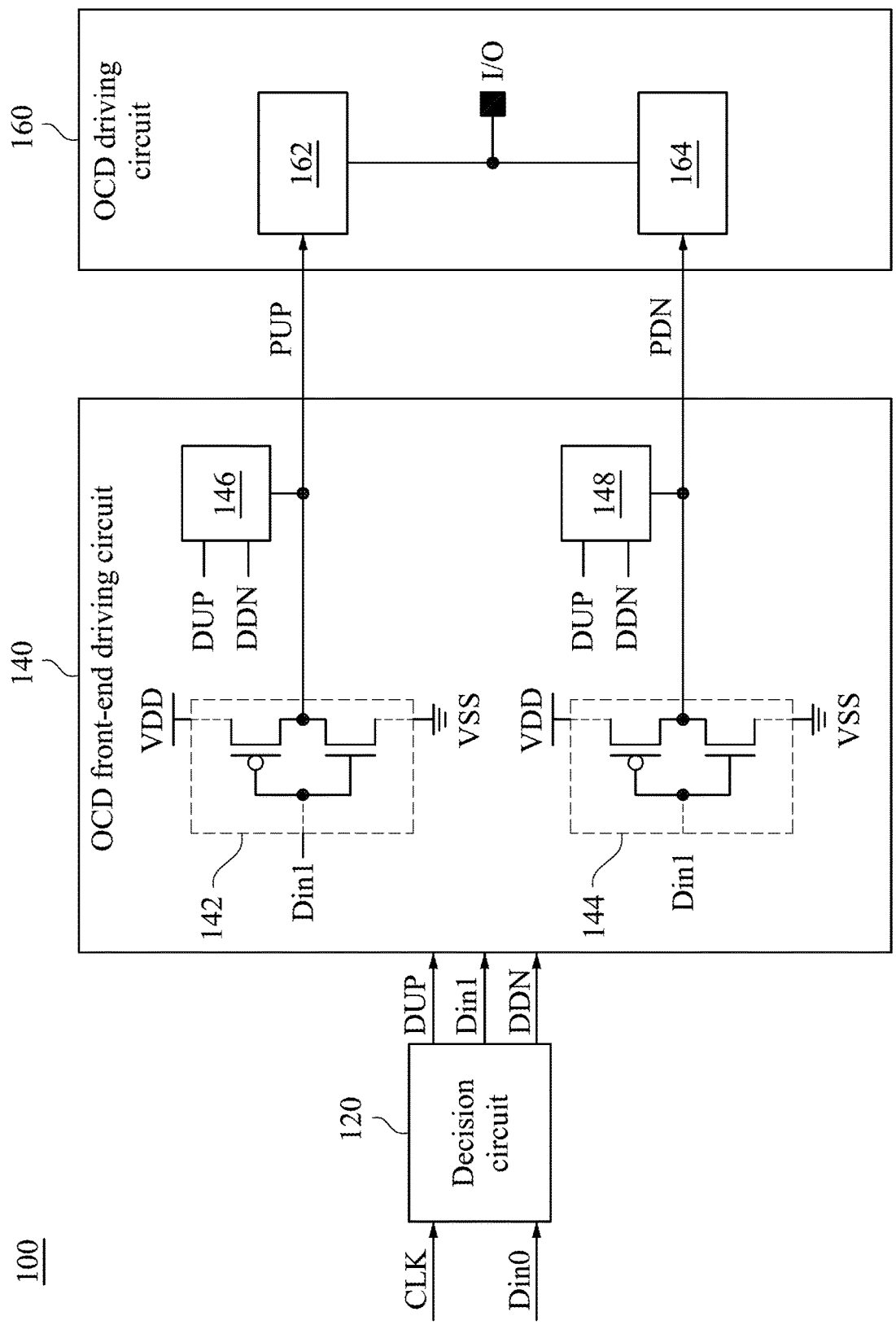
FIG. 1 is a schematic diagram illustrating an off chip driving circuit in accordance with some embodiments of the disclosure.
Figure 3D:
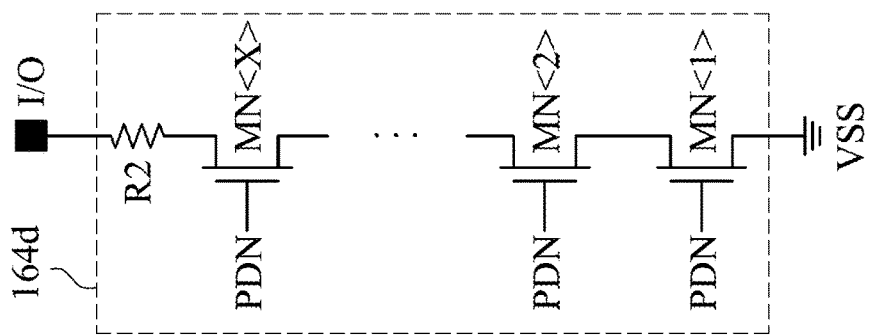
FIGS. 3A~3D are schematic diagrams illustrating pull-down driving circuits in accordance with some embodiments of the disclosure.
Figure 3C:
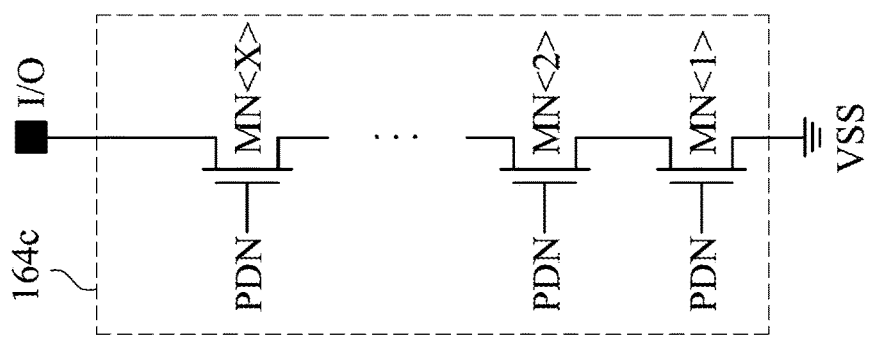
Figure 3B:
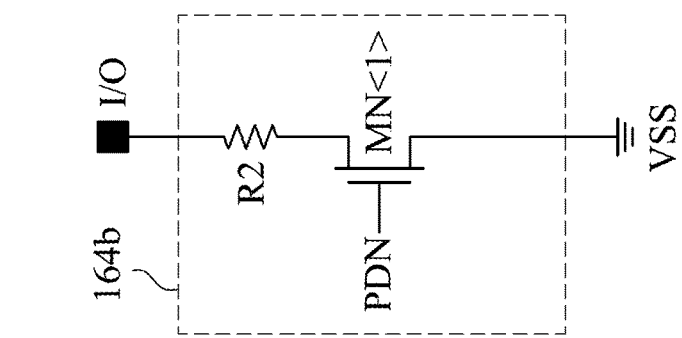
Figure 3A:
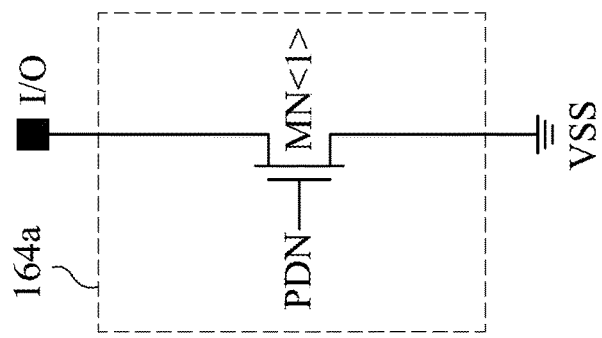

Please refer to FIG. 1. FIG. 1 is a schematic diagram illustrating an off chip driving circuit 100 in accordance with some embodiments of the disclosure. As shown in FIG. 1, the off chip driving circuit 100 includes a decision circuit 120, an off chip driver (OCD) front-end driving circuit 140 and an off chip driver (OCD) driving circuit 160. In some embodiments, the OCD front-end driving circuit 140 includes a first pre-driver 142, a second pre-driver 144, a first adjustable enhancement circuit 146 and a second adjustable enhancement circuit 148. In some embodiments, the OCD driving circuit 160 includes a pull-up driving circuit 162 and a pull-down driving circuit 164.

In structure, the decision circuit 120 is coupled to the OCD front-end driving circuit 140. The OCD front-end driving circuit 140 is coupled to the OCD driving circuit 160. Specifically, the decision circuit 120 is coupled to the first pre-driver 142, the second pre-driver 144, the first adjustable enhancement circuit 146 and the second adjustable enhancement circuit 148. The first pre-driver 142 and the first adjustable enhancement circuit 146 are coupled to the pull-up driving circuit 162. The second pre-driver 144 and the second adjustable enhancement circuit 148 are coupled to the pull-down driving circuit 164.

Please refer to FIGS. 2A~2D. FIGS. 2A~2D are schematic diagrams illustrating pull-up driving circuits 162a~162d in accordance with some embodiments of the disclosure. In some embodiments, the pull-up driving circuit 162 in FIG. 1 may be realized by the pull-up driving circuit 162a includes a transistor MP<1>, as shown in FIG. 2A. A first terminal of the transistor MP<1> is coupled to the high voltage VDD. A second terminal of the transistor MP<1> is coupled to the input/output pad I/O. A control terminal of the transistor MP<1> is configured to receive the pull-up control signal PUP. The transistor MP<1> is configured to be conducted according to the pull-up control signal PUP with a low level, so as to provide the high voltage VDD to the input/output pad I/O.

In some other embodiments, the pull-up driving circuit 162 in FIG. 1 may be realized by the pull-up driving circuit 162b including the transistor MP<1> and a resistor R1 connected in series, as shown in FIG. 2B, or be realized by the pull-up driving circuit 162c including multiple transistors MP<1>~MP<X> connected in series, as shown in FIG. 2C, or be realized by the pull-up driving circuit 162d including multiple transistors MP<1>~MP<X> and the resistor R1 connected in series, as shown in FIG. 2D, in which X is an integer. The structure and operation of the transistors MP<2>~MP<X> is similar to the transistor MP<1>, thus the explanation is omitted. It should be noted that the pull-up driving circuits illustrated in FIG. 2A~2D are merely examples, the pull-up driving circuit 162 may be realized by one or more of the pull-up driving circuits 162a~162d connected in parallel.

Please refer to FIGS. 3A~3D. FIGS. 3A~3D are schematic diagrams illustrating pull-down driving circuits 164a~164d in accordance with some embodiments of the disclosure. In some embodiments, the pull-down driving circuit 164 in FIG. 1 may be realized by the pull-down driving circuit 164a~164d, as shown in FIGS. 3A~3D, respectively. The pull-down driving circuit 164 is similar to the pull-up driving circuit 162, but the p-typed transistors MP<1>~MP<X> are replaced by n-typed transistors MN<1>~MN<X>, the pull-up control signal PUP is replaced by the pull-down control signal PDN, and the high voltage VDD is replaced by the low voltage VSS. For the sake of brevity, the further detail explanation is not repeated herein. It should be noted that the pull-down driving circuits illustrated in FIG. 3A~3D are merely examples, the pull-down driving circuit 164 may be realized by one or more of the pull-down driving circuits 164a~164d connected in parallel.

It should be noted that the pull-up driving circuit 162a~162d and the pull-down driving circuit 164a~164d are merely examples, and not intended to limit the present disclosure. Any circuit that implements the pull-up driver and the pull-down driver is within the scope of this disclosure. That is, the design of the pull-up driving circuit and the pull-down driving circuit may be adjusted by those of ordinary skills in the art.

Please refer back to FIG. 1. In configurationally, the decision circuit 120 is configured to receive a clock CLK and an input data Din0, and to output a first decision signal DUP and a second decision signal DDN according to the input data Din0. The OCD front-end driving circuit 140 is configured to receive the input data Din1, the first decision signal DUP and the second decision signal DDN. The first pre-driver 142 generates a pull-up control signal PUP. The second pre-driver 144 generates a pull-down control signal PDN. The first adjustable enhancement circuit 146 is controlled by the first decision signal DUP and the second decision signal DDN and configured to improve the strength of the pull-up control signal PUP. The second adjustable enhancement circuit 148 is also controlled by the first decision signal DUP and the second decision signal DDN and configured to improve the strength of the pull-down control signal PDN. It should be noted that the clock CLK are merely an example, in some embodiments, the decision circuit 120 is able to generate the input data Din1, the first decision signal DUP and the second decision signal DDN without the clock CLK. The input data Din1 is the input data Din0 with delay so as to align the signals processed by the decision circuit 120. The OCD driving circuit 160 is configured to receive the pull-up control signal PUP and the pull-down control signal PDN, and to induce an output signal corresponding to an input/output pad I/O.

Specifically, the first pre-driver 142 is configured to receive the input data Din1 and to selectively provide the high voltage VDD or the low voltage VSS as the pull-up control signal PUP according to the input data Din1. The second pre-driver 144 is configured to receive the input data Din1 and to selectively provide the high voltage VDD or the low voltage VSS as the pull-down control signal PDN according to the input data Din1. The first adjustable enhancement circuit 146 is configured to receive the first decision signal DUP and the second decision signal DDN and to selectively provide the high voltage VDD or the low voltage VSS as the pull-up control signal PUP according to the first decision signal DUP and the second decision signal DDN. The second adjustable enhancement circuit 148 is configured to receive the first decision signal DUP and the second decision signal DDN and to selectively provide the high voltage VDD or the low voltage VSS as the pull-down control signal PDN according to the first decision signal DUP and the second decision signal DDN.

In some embodiments, the first pre-driver 142 and the second pre-driver 144 are CMOS. For example, as shown in FIG. 1, the first pre-driver 142 includes a PMOS and a NMOS. A first terminal of the PMOS is configured to receive the high voltage VDD, a second terminal of the NMOS is configured to receive the low voltage VSS, control terminals of the PMOS and the NMOS are configured to receive the input data Din1, and the second terminal of the PMOS and the first terminal of the NMOS are configured to output the pull-up control signal PUP. The second pre-driver 144 is similar to the first pre-driver 142, thus the explanation is omitted.

It should be noted that the pre-drivers 142,144 may be realized by other circuits besides the CMOS, or the pre-drivers 142, 144 may include other circuit between the CMOS and the high voltage VDD, the CMOS and the low voltage VSS or the CMOS and the input data Din1. In some other embodiments, the pre-drivers 142,144 may include one or more transistors connected in series or in parallel.

Figure 4:
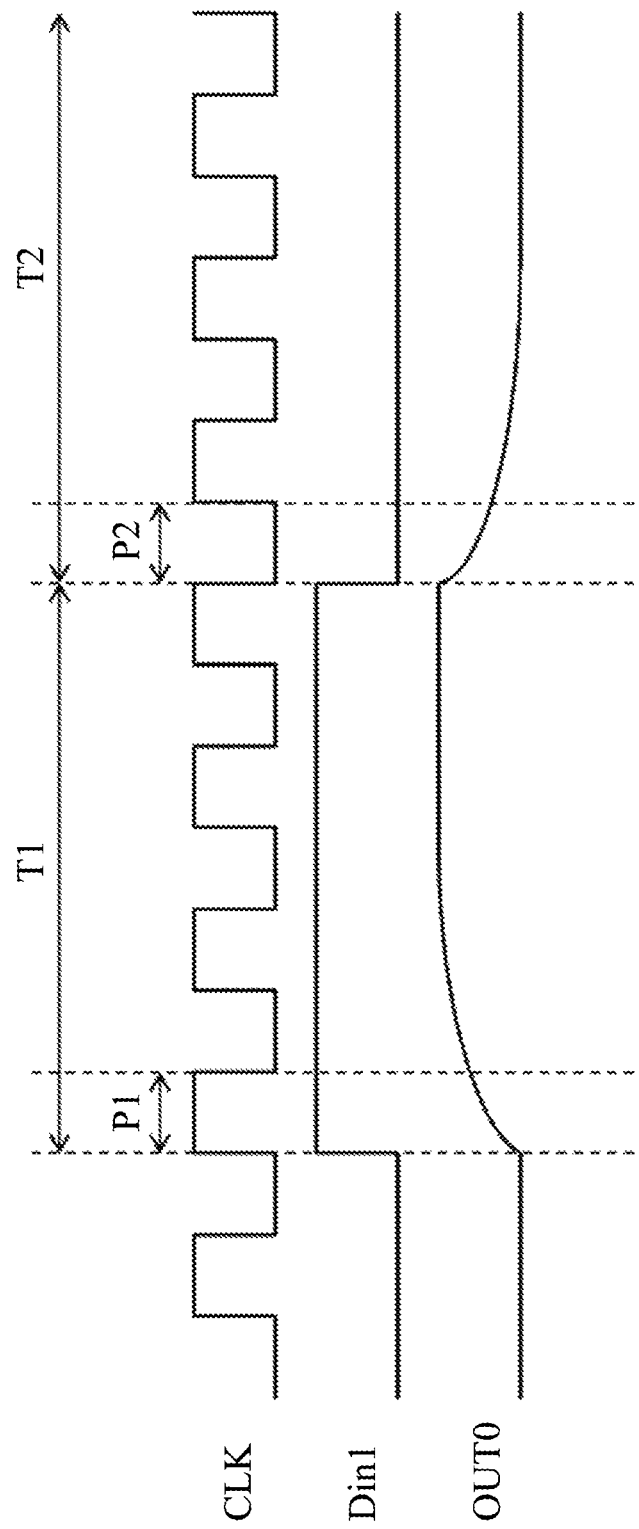
FIG. 4 is a schematic diagram illustrating signals of an off chip driving circuit in prior art.

Please refer to FIG. 1 and FIG. 4 together. FIG. 4 is a schematic diagram illustrating signals of an off chip driving circuit 100 in prior art. As shown in FIG. 4, in a time period T1, the input data Din1 is at high level. The PMOS of the pre-drivers 142,144 turn off and the NMOS of the pre-drivers 142,144 conduct according to the input data Din1 with high level, so as to provide the low voltage VSS as the pull-up control signal PUP and the pull-down control signal PDN. Therefore, the pull-up driving circuit 162 turns on according to the pull-up control signal PUP with the low voltage VSS, and the pull-down driving circuit 164 turns off according to the pull-down control signal PDN with the low voltage VSS. In this way, in a time period T1, the OCD driving circuit 160 induces the output signal with the high voltage VDD corresponding to the input/output pad I/O.

On the other hand, in a time period T2, the input data Din1 is at low level. The PMOS of the pre-drivers 142,144 turn on and the NMOS of the pre-drivers 142,144 turn off according to the input data Din1 with low level, so as to provide the high voltage VDD as the pull-up control signal PUP and the pull-down control signal PDN. Therefore, the pull-up driving circuit 162 turns off according to the pull-up control signal PUP with the high voltage VDD, and the pull-down driving circuit 164 turns on according to the pull-down control signal PDN with the high voltage VDD. In this way, in a time period T2, the OCD driving circuit 160 induces the output signal with the low voltage VSS corresponding to the input/output pad I/O.

Accordingly, the output signal of the input/output pad I/O should ideally be the same as the input data Din1. However, in high speed data transmission, as shown in FIG. 4, at the beginning of the input data Din1 turning from low level to high level, the first output data of the output signal OUT0, as the waveform of the time period P1 shown in FIG. 4, is too low to be clear. Similarly, at the beginning of the input data Din1 turning from high level to low level, the first output data of the output signal OUT0, as the waveform of the time period P2 shown in FIG. 4, is too high to be clear. Therefore, in the present disclosure, the decision circuit 120 and the OCD front-end driving circuit 140 are able to enhance the pull-up control signal PUP and the pull-down control signal PDN according to the signal compensation method, so that the output signal of the input/output pad I/O is able to be clearer (less distortion). About the signal compensation method will be described in the following paragraphs.

Figure 5:
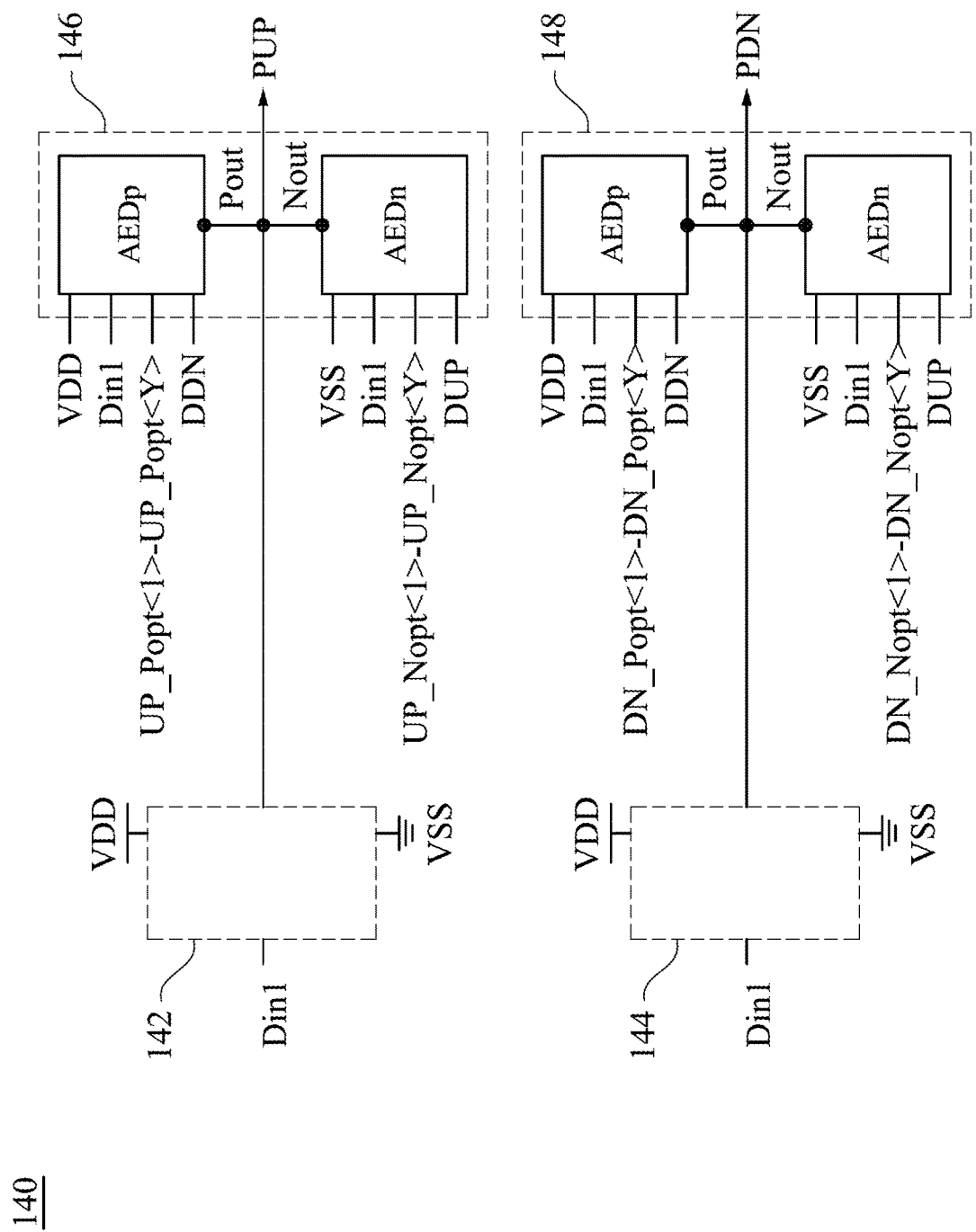
FIG. 5 is a schematic diagram illustrating an off chip driver front-end driving circuit in accordance with some embodiments of the disclosure.

Please refer to FIG. 5. FIG. 5 is a schematic diagram illustrating an OCD front-end driving circuit 140 in accordance with some embodiments of the disclosure. As shown in FIG. 5, in some embodiments, the first adjustable enhancement circuit 146 and the second adjustable enhancement circuit 148 of the OCD front-end driving circuit 140 both include enhancement components AEDp and AEDn.

Specifically, the enhancement component AEDp of the first adjustable enhancement circuit 146 is configured to receive and operate according to the high voltage VDD, the input data Din1, one or more optional signals UP_Popt<1>~UP_Popt<Y> and the second decision signal DDN. The enhancement component AEDn of the first adjustable enhancement circuit 146 is configured to receive and operate according to the low voltage VSS, the input data Din1, one or more optional signals UP_Nopt<1>~UP_Nopt<Y> and the first decision signal DUP.

Similarly, the enhancement component AEDp of the second adjustable enhancement circuit 148 is configured to receive and operate according to the high voltage VDD, the input data Din1, one or more optional signals DN_Popt<1>~DN_Popt<Y> and the second decision signal DDN. The enhancement component AEDn of the second adjustable enhancement circuit 148 is configured to receive and operate according to the low voltage VSS, the input data Din1, one or more optional signals DN_Nopt<1>~DN_Nopt<Y> and the first decision signal DUP.

Figure 6:
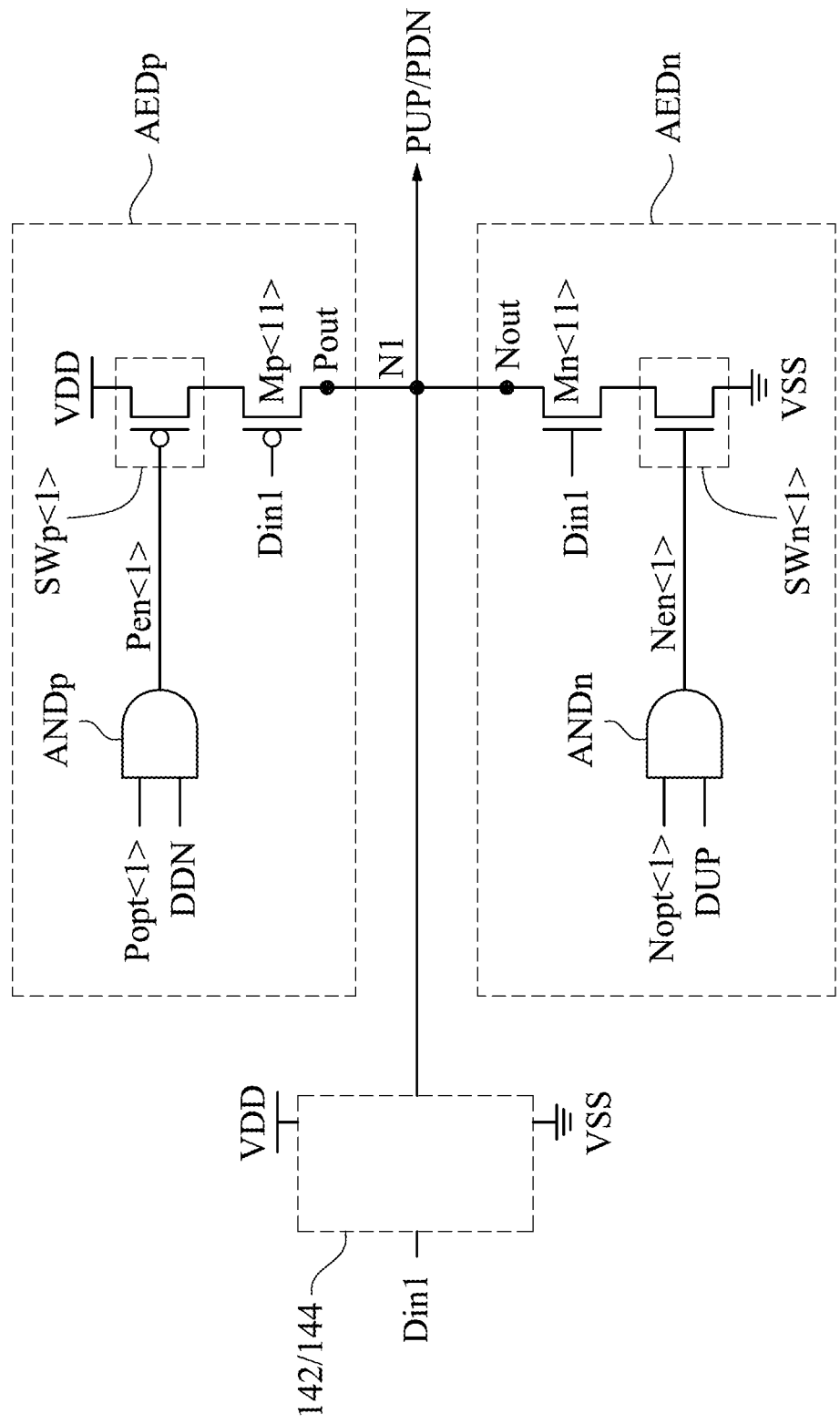
FIG. 6 is a schematic diagram illustrating a compensation circuit in accordance with some embodiments of the disclosure.

Please refer to FIG. 6. FIG. 6 is a schematic diagram illustrating a compensation circuit in accordance with some embodiments of the disclosure. In some embodiments, the adjustable enhancement circuits 146 and 148 both may be realized by the same circuit as shown in FIG. 6. For example, the enhancement component AEDp shown in FIG. 6 may be realized the enhancement component AEDp in FIG. 5, and the enhancement component AEDn shown in FIG. 6 may be realized the enhancement component AEDn in FIG. 5.

It should be noted that the adjustable enhancement circuits 146 and 148 may include one or more the enhancement components AEDp and AEDn. For convenience and clarity of explanation, the following description will be explained first with one enhancement component AEDp including a switch SWp<1> and a first transistor Mp<11> and one enhancement component AEDn including a switch SWn<1> and a second transistor Mn<11> as an example. In addition, for convenience and clarity of explanation, the optional signals UP_Popt<1>~UP_Popt<Y> and DN_Popt<1>~DN_Popt<Y> are indicated by Popt<1>, and the optional signals UP_Nopt<1>~UP_Nopt<Y> and DN_Nopt<1>~DN_Nopt<Y> are indicated by Nopt<1>.

In some embodiments, as shown in FIG. 6, the enhancement component AEDp includes a AND circuit ANDp, a switch SWp<1> and a first transistor Mp<11>. The enhancement component AEDn includes a AND circuit ANDn, a switch SWn<1> and a second transistor Mn<11>. As shown in FIG. 6, the switch SWp<1> is realized by a PMOS, and the switch SWn<1> is realized by a NMOS, but the present disclosure is not limited to these.

In structure, the AND circuits ANDp and ANDn are coupled to a node N1. The AND circuit ANDp is coupled to the first switch SWp<1>, the first switch SWp<1> is connected to the first transistor Mp<11> in series, and the first transistor Mp<11> is coupled to the output terminal of the pre-driver (i.e., node Pout). Similarly, the AND circuit ANDn is coupled to the second switch SWn<1>, the second switch SWn<1> is connected to the second transistor Mn<11> in series, and the second transistor Mn<11> is coupled to the output terminal of the pre-driver (i.e., node Nout).

In configurationally, the AND circuit ANDp is configured to receive the optional signal Popt<1> and the second decision signal DDN, to generate a enable signal Pen<1> according to the optional signal Popt<1> and the second decision signal DDN, and to output the enable signal Pen<1> to the control terminal of the first switch SWp<1>.

The first switch SWp<1> is configured to be conducted according to the enable signal Pen<1> with the low level, and the first transistor Mp<11> is configured to be conducted according to the input data Din1 with the low level, so as to provide the high voltage VDD as the control signals PUP and PDN to the OCD driving circuit 160.

Similarly, the AND circuit ANDn is configured to receive the optional signal Nopt<1> and the first decision signal DUP, to generate a enable signal Nen<1> according to the optional signal Nopt<1> and the first decision signal DUP, and to output the enable signal Nen<1> to the control terminal of the second switch SWn<1>. The second switch SWn<1> is configured to be conducted according to the enable signal Nen<1> with the high level, and the second transistor Mn<11> is configured to be conducted according to the input data Din1 with the high level, so as to provide the low voltage VSS as the control signals PUP and PDN to the OCD driving circuit 160.

Figure 7:
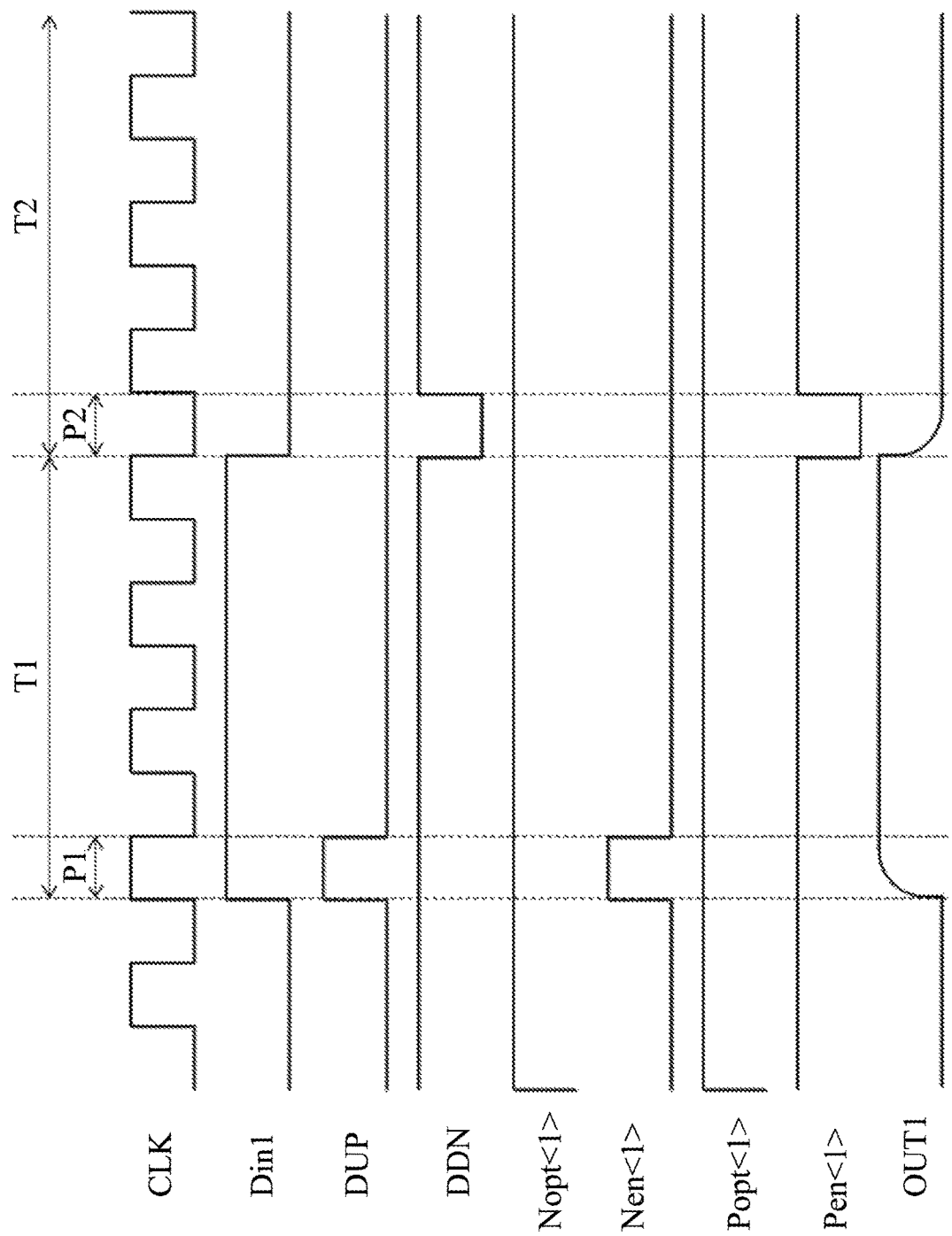
FIG. 7 is a schematic diagram illustrating signals of an off chip driving circuit in accordance with some embodiments of the disclosure.

Please refer to FIG. 6 and FIG. 7 together. FIG. 7 is a schematic diagram illustrating signals of an off chip driving circuit 100 in accordance with some embodiments of the disclosure. For the convenience of explanation, the operation of the enhancement component AEDp and AEDn illustrated in FIG. 6 is explained with accompanying of the signals of FIG. 7. As shown in FIG. 7, in the time period P1, the decision signals DUP and DDN are at high level, the optional signals Nopt<1> and Popt<1> are also at high level. Therefore, the enable signals Pen<1> and Nen<1> generated by the AND circuits ANDp and ANDn are both at high level, and so that the first switch SWp<1> turns off and the second switch SWn<1> turns on. In addition, in the time period P1, the input data Din1 is at high level, so that the first transistor Mp<11> turns off and the second transistor Mn<11> turns on. Accordingly, in time period P1, the enhancement component AEDn provides the low voltage VSS as the pull-up control signal PUP and the pull-down control signal PDN to the OCD driving circuit 160, so as to enhance the slew rate of the pull-up control signal PUP and the pull-down control signal PDN in order to improve the ability of turning on the p-type transistors in the pull-up driving circuit 162 and turning off the n-type transistors in the pull-down driving circuit 164. In this way, the output signal OUT1 induced corresponding to the input/output pad I/O become high level earlier in time period P1.

Similarly, in the time period P2, the decision signals DUP and DDN are at low level, the optional signals Nopt<1> and Popt<1> are at high level. Therefore, the enable signals Pen<1> and Nen<1> generated by the AND circuits ANDp and ANDn are both at low level, and so that the first switch SWp<1> turns on and the second switch SWn<1> turns off. In addition, in the time period P2, the input data Din1 is at low level, so that the first transistor Mp<11> turns on and the second transistor Mn<11> turns off. Accordingly, in time period P2, the enhancement component AEDp provides the high voltage VDD as the pull-up control signal PUP and the pull-down control signal PDN to the OCD driving circuit 160, so as to enhance the slew rate of the pull-up control signal PUP and the pull-down control signal PDN in order to improve the ability of turning off the p-type transistors in the pull-up driving circuit 162 and turning on the n-type transistors in the pull-down driving circuit 164. In this way, the output signal OUT1 induced corresponding to the input/output pad I/O become low level earlier in time period P2.

Therefore, by the adjustable enhancement circuit enhancing the slew rate of the pull-up control signal PUP and the pull-down control signal PDN, at the beginning of the input data Din1 turning from low level to high level or high level to low level, the output signal OUT1 induced corresponding to the input/output pad I/O by the OCD driving circuit 160, as the waveform of the time periods P1, P2 shown in FIG. 7, is able to be clear.

In some embodiments, the first decision signal DUP and the second decision signal DDN are generated by the decision circuit 120 according to the input data Din1 and the clock CLK It should be noted that the clock CLK are merely an example, in some embodiments, the decision circuit 120 is able to generate the input data Din1, the first decision signal DUP and the second decision signal DDN without the clock CLK. Specifically, the decision circuit 120 receives the input data Din1 and compares the voltage level of the next input data and the present one. When the voltage level of the next input data is higher than the voltage level of the present input data, the decision circuit 120 generates a pulse of the first decision signal DUP (as the waveform show in time period P1 of FIG. 7). When the voltage level of the next input data is lower than the voltage level of the present input data, the decision circuit 120 generates a pulse of the second decision signal DDN (as the waveform show in time period P2 of FIG. 7). In some embodiments, the decision circuit 120 may be realized by some components of a feed forward equalizer or some components of pre-emphasis decision technical circuit.

Figure 8B:
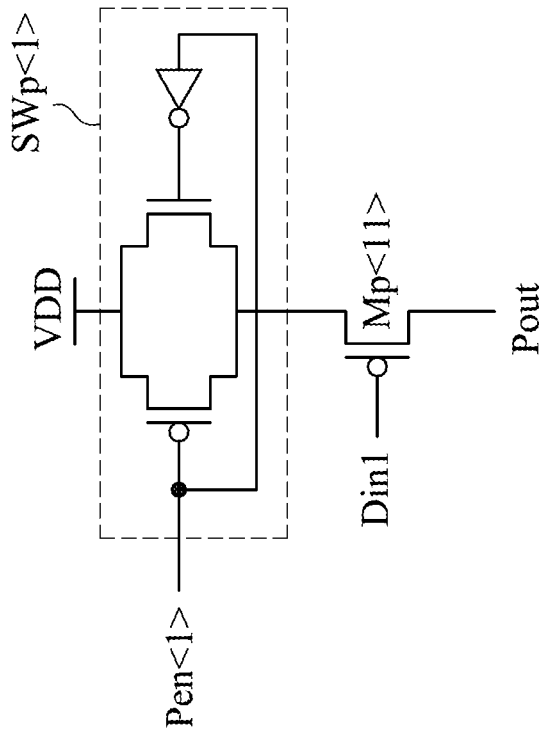
FIGS. 8A and 8B are schematic diagrams illustrating first switches in accordance with some embodiments of the disclosure.
Figure 8A:
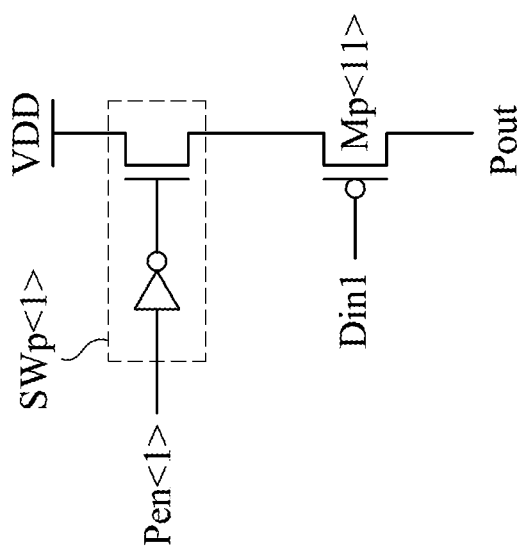

Please refer to FIGS. 8A and 8B. FIGS. 8A and 8B are schematic diagrams illustrating first switches SWp<1> in accordance with some embodiments of the disclosure. As shown in FIG. 8A, in some embodiments, the switch SWp<1> may be realized by a NMOS with a NOT gate. Specifically, a first terminal of the NMOS is configured to receive the high voltage VDD, a second terminal of the NMOS is coupled to the first transistor Mp<11>, and a control terminal of the NMOS is configured to receive the enable signal Pen<1> through the NOT gate.

And as shown in FIG. 8B, in some other embodiments, the switch SWp<1> may be realized by a CMOS bilateral switch. Specifically, the CMOS bilateral switch composed of a PMOS, a NMOS and a NOT gate. A first terminal of the PMOS and a first terminal of the NMOS are configured to receive the high voltage VDD. A second terminal of the PMOS and a second terminal of the NMOS are coupled to the first transistor Mp<11>. A control terminal of the PMOS is configured to receive the enable signal Pen<1>, and the control terminal of the NMOS is configured to receive the enable signal Pen<1> through the NOT gate.

Figure 9B:
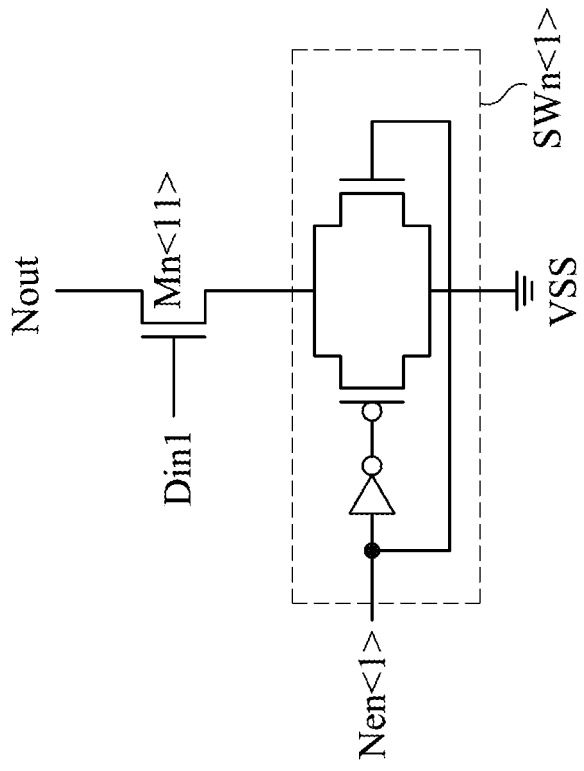
FIGS. 9A and 9B are schematic diagrams illustrating second switches in accordance with some embodiments of the disclosure.
Figure 9A:
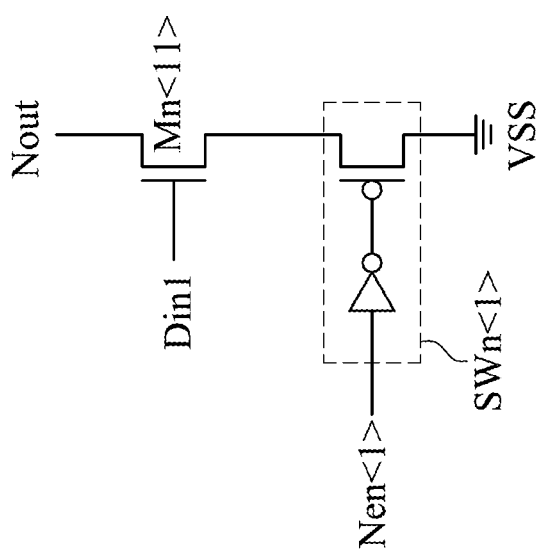

Please refer to FIGS. 9A and 9B. FIGS. 9A and 9B are schematic diagrams illustrating second switches SWn<1> in accordance with some embodiments of the disclosure. As shown in FIG. 9A, in some embodiments, the switch SWn<1> may be realized by a PMOS with a NOT gate. Specifically, a first terminal of the PMOS is configured to receive the low voltage VSS, a second terminal of the PMOS is coupled to the second transistor Mn<11>, and a control terminal of the PMOS is configured to receive the enable signal Nen<1> through the NOT gate.

And as shown in FIG. 9B, in some other embodiments, the switch SWn<1> may be realized by a CMOS bilateral switch. Specifically, the CMOS bilateral switch composed of a PMOS, a NMOS and a NOT gate. A first terminal of the PMOS and a first terminal of the NMOS are configured to receive the low voltage VSS. A second terminal of the PMOS and a second terminal of the NMOS are coupled to the second transistor Mn<11>. A control terminal of the NMOS is configured to receive the enable signal Nen<1>, and the control terminal of the PMOS is configured to receive the enable signal Nen<1> through the NOT gate.

Figure 10A:
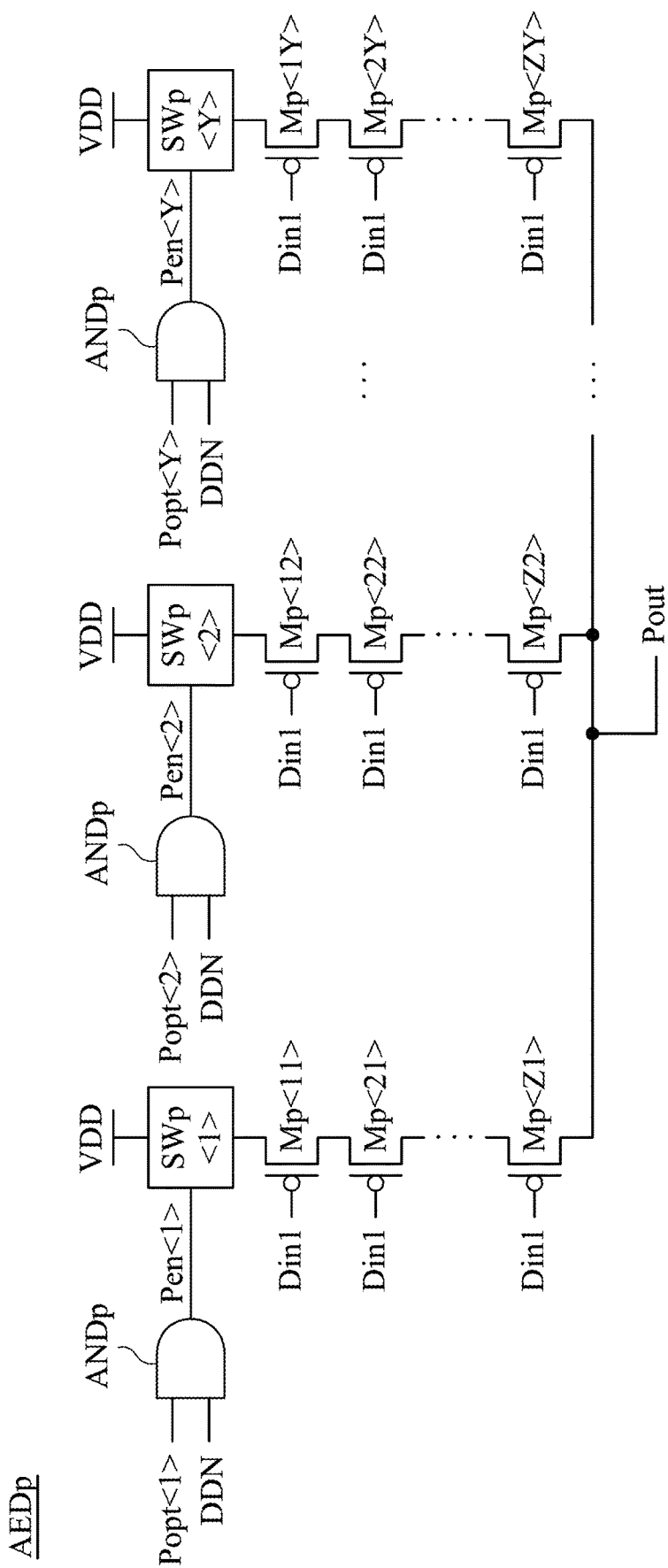
FIGS. 10A and 10B are schematic diagrams illustrating first enhancement components in accordance with some embodiments of the disclosure.
Figure 10B:
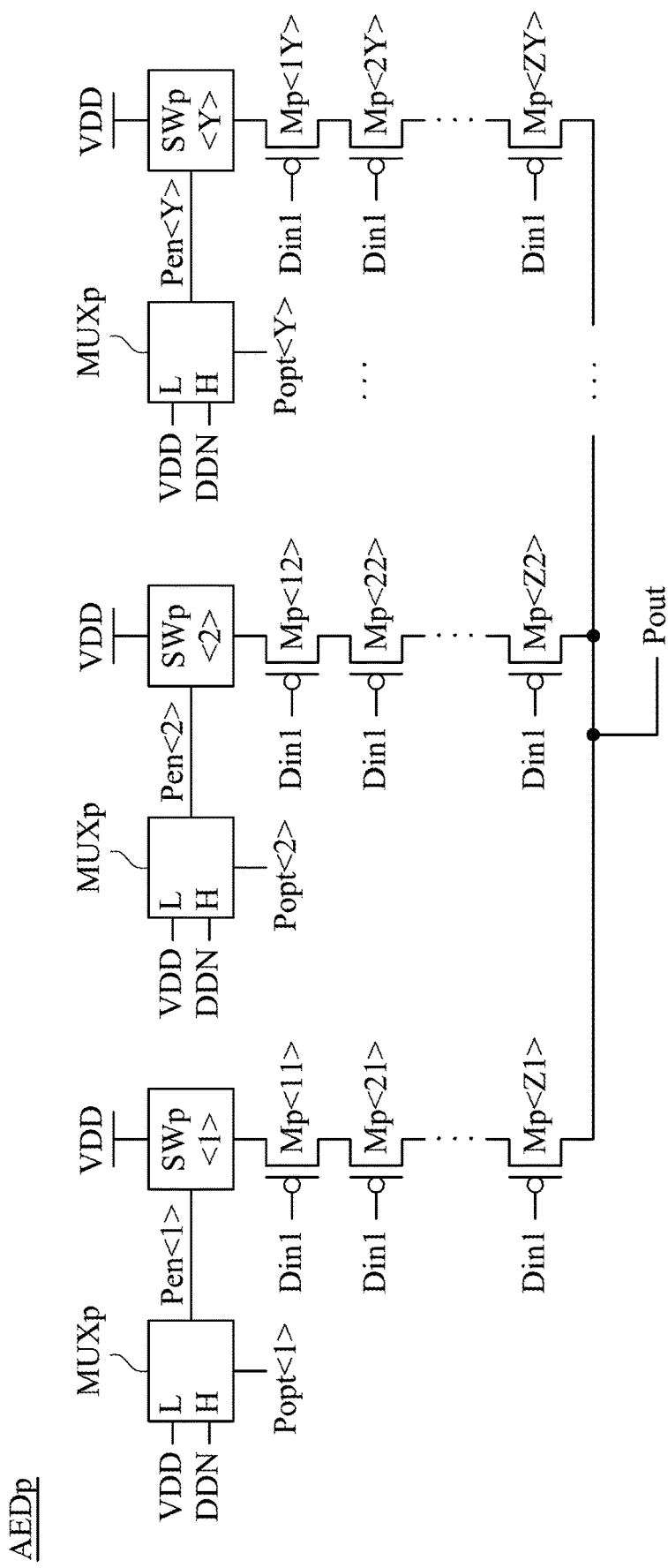

About the embodiments of the adjustable enhancement circuits 146, 148 including a plurality of first enhancement components, please refer to FIGS. 10A and 10B. FIGS. 10A and 10B are schematic diagrams illustrating first enhancement components AEDp in accordance with some embodiments of the disclosure. In some embodiments, the first enhancement component AEDp in FIG. 6 may be replaced by parallel connected first enhancement components AEDp shown in FIGS. 10A and 10B. In FIGS. 10A and 10B, similar elements related to the embodiments in FIG. 6 are represented by the same reference symbols for ease of understanding, and the detail explanation is omitted. In addition, in the embodiments of FIG. 10A, the first switches SWp<2>~SWp<Y> are similar to the first switch SWp<1>, and the first transistors Mp<12>~Mp<ZY> are similar to the first transistor Mp<11>, thus the detailed explanation is omitted.

As shown in FIG. 10A, there are one or more first switches SWp<1>~SWp<Y>, in which Y is an integer. Each of the first switches SWp<1>~SWp<Y> may be connected to one or more first transistors in series, in which Z is an integer. For example, the first switch SWp<1> is connected to first transistors Mp<11>~Mp<Z1> in series. The first switch SWp<2> is connected to first transistors Mp<12>~Mp<Z2> in series. And so on, the first switch SWp<Y> is connected to first transistors Mp<1Y>~Mp<ZY> in series.

For example, in some embodiments, as Y=1, it means that there are one first enhancement component AEDp including an AND circuit, a first switch SWp<1> and a string of first transistors Mp<11>~Mp<Z1>. In some other embodiments, as Y=2, it means that there are two first enhancement components AEDp including two AND circuits, two first switches SWp<1>~SWp<2> and two strings of first transistors Mp<11>~Mp<Z1>, Mp<12>~Mp<Z2>. And so on, in some other embodiments, as Y=any integer k1, it means that there are k1 first enhancement components AEDp including k1 AND circuits, k1 first switches SWp<1>~SWp<k1> and k1 strings of first transistors Mp<11>~Mp<Z1>, Mp<12>~Mp<Z2> . . . . Mp<1(k1)>~Mp<Z(k1)>. Similarly, in some other embodiments, as Y=1 and Z=1, it means that there is one first transistor Mp<11> connected to the first switch SWp<1>. In some other embodiments, as Y=1, Z=2, it means that there are two first transistors Mp<11>~Mp<21> connected to the first switch SWp<1>. And so on, in some other embodiments, as Y=1, Z=any integer k2, it means that there are k2 first transistors Mp<11>~Mp<(k2)1> connected to the first switch SWp<1>.

Furthermore, it should be noted that, though the number of the first transistors connected to each first switch illustrated in FIG. 10A is the same (i.e., Z first transistors), in some other embodiments, numbers of the first transistors connected to each first switch are different. For example, there may be one first transistor Mp<11> connected to the first switch SWp<1>, two first transistors Mp<12>~Mp<22> connected to the first switch SWp<2>, and four first transistors Mp<13>~Mp<43> connected to the first switch SWp<3>.

In configurationally, the first switch SWp<1> is configured to be conducted according to the enable signal Pen<1> with low level, and the enable signal Pen<1> is generated by the AND circuit according to the corresponding optional signal Popt<1> with high level and second decision signal DDN with low level. The first switch SWp<2> is configured to be conducted according to the enable signal Pen<2> with low level, and the enable signal Pen<2> is generated by the AND circuit according to the corresponding optional signal Popt<2> with high level and second decision signal DDN with low level. And so on, the first switch SWp<Y> is configured to be conducted according to the enable signal Pen<Y> with low level, and the enable signal Pen<Y> is generated by the AND circuit according to the corresponding optional signal Popt<Y> with high level and second decision signal DDN with low level.

In this way, by adjusting the number of the optional signal Popt<1>~Popt<Y>, the number of the enable signals Pen<1>~Pen<Y> being at the low level and the number of the first switches SWp<1>~SWp<Y> conducted are able to be controlled. In other words, the number of the first optional signals with high level is equal to the number of the first enable signals being at low level and equal to the number of the first switches conducted. Therefore, the slew rate of rising the control signals PUP or PDN may be designed by adjusting the number of the optional signals Popt<1>~Popt<Y> output by the OCD front-end driving circuit 140.

Please refer to FIG. 10B. In the embodiments of FIG. 10B, compared to the embodiments of FIG. 10A, the first enhancement components AEDp include multiplexers MUXp instead of AND circuits. As shown in FIG. 10B, the control terminal of the first switch SWp<1> is coupled to an output terminal of the multiplexer MUXp. An input terminal with pin of the multiplexer MUXp is coupled to the high voltage VDD. An input terminal with CH' pin of the multiplexer MUXp is configured to receive the second decision signal DDN. A control terminal of the multiplexer MUXp is configured to receive the first optional signal Popt<1>. The multiplexer MUXp is configured to output one of signals receiving by the two input terminals according to the first optional signal Popt<1>.

For example, when the first optional signal Popt<1> is at high level as shown in FIG. 7, the multiplexer MUXp outputs the signal of input terminal with CH' pin, so that the enable signal Pen<1> is at low level when the second decision signal DDN is at low level, as the waveform shown in time period P2 of FIG. 7, and the enable signal Pen<1> is at high level when the second decision signal DDN is at high level.

Figure 11A:
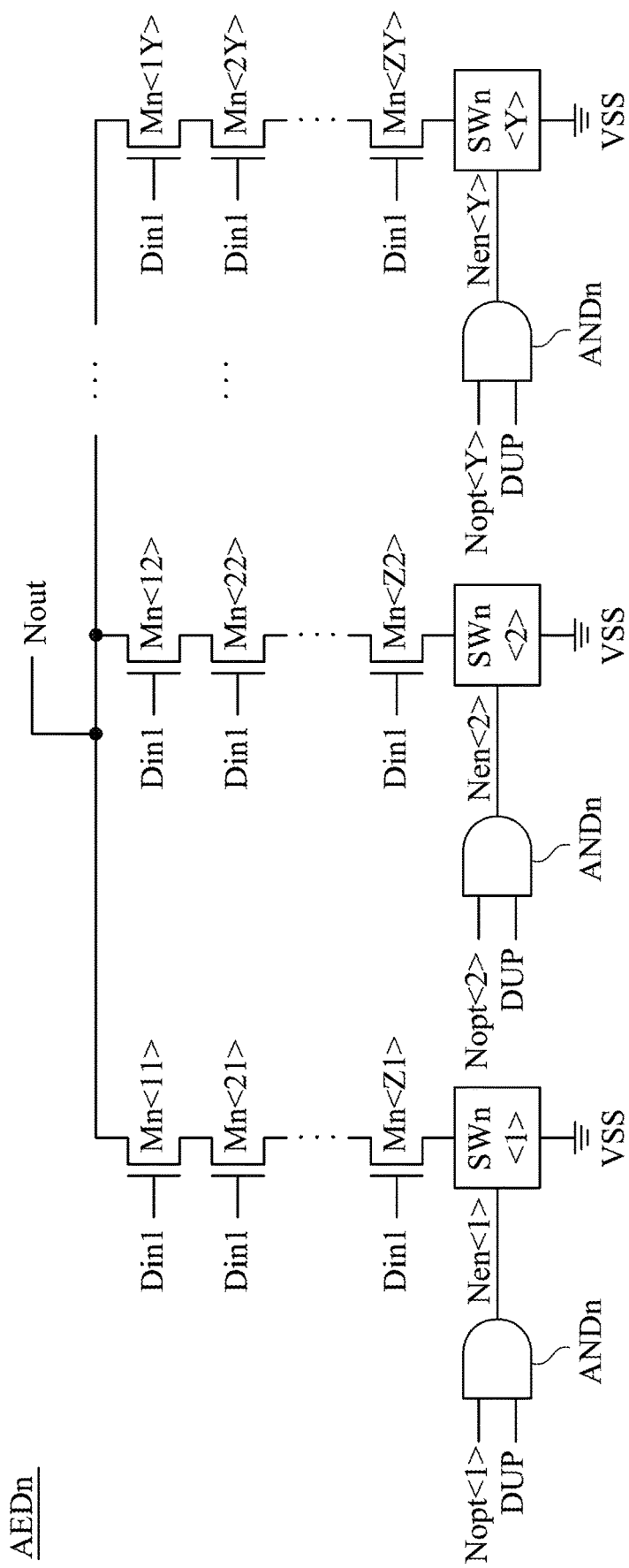
FIGS. 11A and 11B are schematic diagrams illustrating second enhancement components in accordance with some embodiments of the disclosure.
Figure 11B:
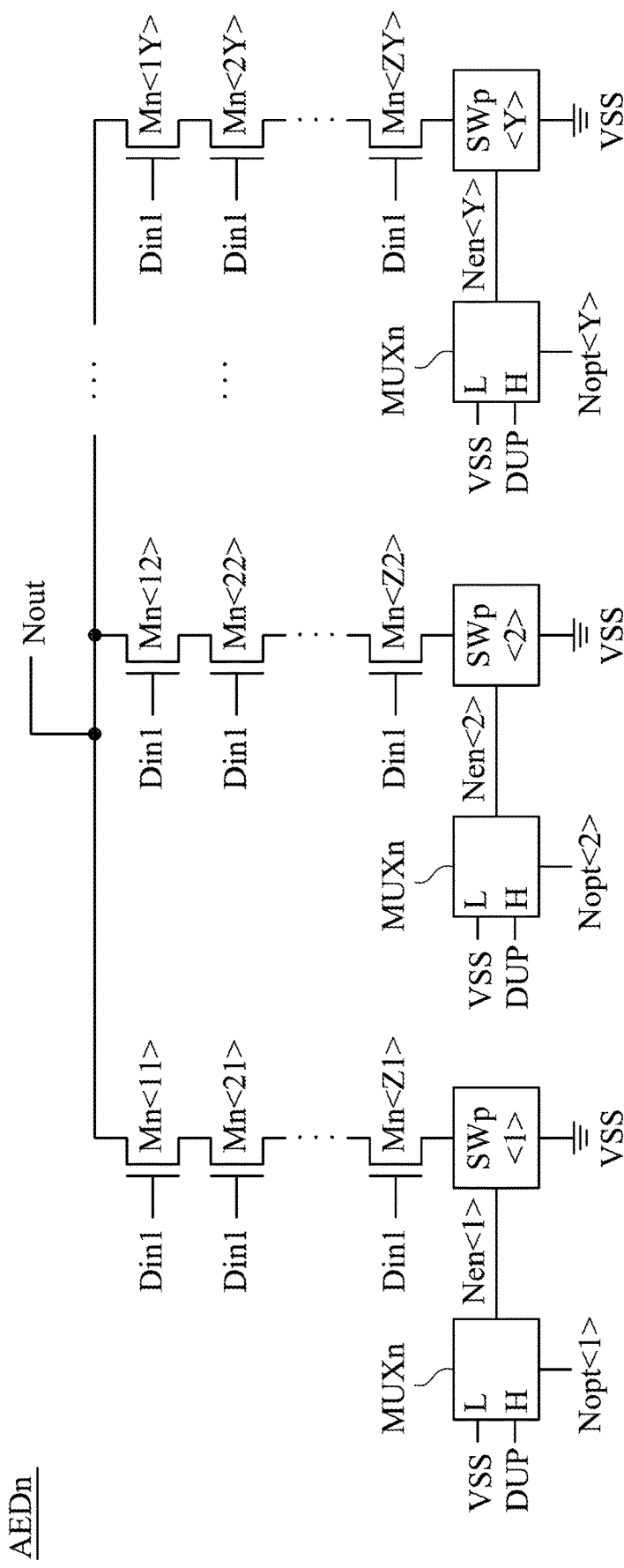

About the embodiments of the adjustable enhancement circuits 146, 148 including a plurality of second enhancement components, please refer to FIGS. 11A and 11B. FIGS. 11A and 11B are schematic diagrams illustrating second enhancement components AEDn in accordance with some embodiments of the disclosure. In some embodiments, the second enhancement component AEDn in FIG. 6 may be replaced by parallel connected second enhancement components AEDn shown in FIGS. 11A and 11B. In FIGS. 11A and 11B, similar elements related to the embodiments in FIG. 6 are represented by the same reference symbols for ease of understanding, and the detail explanation is omitted. In addition, in the embodiments of FIG. 11A, the second switches SWn<2>~SWn<Y> are similar to the second switch SWn<1>, and the second transistors Mn<12>~Mn<ZY> are similar to the second transistor Mn<11>, thus the detailed explanation is omitted.

As shown in FIG. 11A, there are one or more second switches SWn<1>~SWn<Y>, in which Y is an integer. Each of the first switches SWn<1>~SWn<Y> may be connected to one or more second transistors in series, in which Z is an integer. For example, the second switch SWn<1> is connected to second transistors Mn<11>~Mn<Z1> in series. The second switch SWn<2> is connected to second transistors Mn<12>~Mn<Z2> in series. And so on, the second switch SWn<Y> is connected to second transistors Mn<1Y>~Mn<ZY> in series.

For example, in some embodiments, as Y=1, it means that there are one second enhancement component AEDn including an AND circuit, a second switch SWn<1> and a string of second transistors Mn<11>~Mn<Z1>. In some other embodiments, as Y=2, it means that there are two second enhancement components AEDn including two AND circuits, two second switches SWn<1>~SWn<2> and two strings of second transistors Mn<11>~Mn<Z1>, Mn<12>~Mn<Z2>. And so on, in some other embodiments, as Y=any integer k3, it means that there are k3 second enhancement components AEDn including k3 AND circuits, k3 second switches SWn<1>~SWn<k3> and k3 strings of second transistors Mn<11>~Mn<Z1>, Mn<12>~Mn<Z2> . . . . Mn<1(k3)>~Mn<Z(k3)>. Similarly, in some other embodiments, as Y=1 and Z=1, it means that there is one second transistor Mn<11> connected to the second switch SWn<1>. In some other embodiments, as Y=1, Z=2, it means that there are two second transistors Mn<11>~Mn<21> connected to the second switch SWn<1>. And so on, in some other embodiments, as Y=1, Z=any integer k4, it means that there are k4 second transistors Mn<11>~Mn<(k4)1> connected to the second switch SWn<1>.

Furthermore, it should be noted that, though the number of the second transistors connected to each second switch illustrated in FIG. 11A is the same (i.e., Z second transistors), in some other embodiments, numbers of the second transistors connected to each second switch are different. For example, there may be one second transistor Mn<11> connected to the second switch SWn<1>, two second transistors Mn<12>~Mn<22> connected to the second switch SWn<2>, and four second transistors Mn<13>~Mn<43> connected to the second switch SWn<3>.

In configurationally, the second switch SWn<1> is configured to be conducted according to the enable signal Nen<1> with high level, and the enable signal Nen<1> is generated by the AND circuit according to the corresponding optional signal Nopt<1> with high level and first decision signal DUP with high level. The second switch SWn<2> is configured to be conducted according to the enable signal Nen<2> with high level, and the enable signal Nen<2> is generated by the AND circuit according to the corresponding optional signal Nopt<2> with high level and first decision signal DUP with high level. And so on, the second switch SWn<Y> is configured to be conducted according to the enable signal Nen<Y> with high level, and the enable signal Nen<Y> is generated by the AND circuit according to the corresponding optional signal Nopt<Y> with high level and first decision signal DUP with high level.

In this way, by adjusting the number of the optional signal Nopt<1>~Nopt<Y>, the number of the enable signals Nen<1>~Nen<Y> being at the high level and the number of the second switches SWn<1>~SWn<Y> conducted are able to be controlled. In other words, the number of the second optional signals with high level is equal to the number of the second enable signals being at high level and equal to the number of the second switches conducted. Therefore, the slew rate of dropping the control signals PUP or PDN may be designed by adjusting the number of the optional signals Nopt<1>~Nopt<Y> output by the OCD front-end driving circuit 140. Due to the increment of the slew rate of the signals outputted by the OCD front-end driving circuit 140, the signals outputted by the OCD driving circuit 160 are able to be improved.

Please refer to FIG. 11B. In the embodiments of FIG. 11B, compared to the embodiments of FIG. 11A, the second enhancement components AEDn include multiplexers MUXn instead of AND circuits. As shown in FIG. 11B, the control terminal of the second switch SWn<1> is coupled to an output terminal of the multiplexer MUXn. An input terminal with pin of the multiplexer MUXn is coupled to the low voltage VSS. An input terminal with CH' pin of the multiplexer MUXn is configured to receive the first decision signal DUP. A control terminal of the multiplexer MUXn is configured to receive the second optional signal Nopt<1>. The multiplexer MUXn is configured to output one of signals receiving by the two input terminals according to the second optional signal Nopt<1>.

For example, when the second optional signal Nopt<1> is at high level as shown in FIG. 7, the multiplexer MUXn outputs the signal of input terminal with CH' pin, so that the enable signal Nen<1> is at low level when the first decision signal DUP is at low level, and the enable signal Nen<1> is at high level when the first decision signal DUP is at high level, as the waveform shown in time period P1 of FIG. 7.

It should be noted that the adjustable enhancement circuits 146, 148 are merely examples, and not intended to limit the present disclosure. Any circuit or combination of logic gates that may generate signals (i.e., the enable signals Pen<1> and Nen<1>) for controlling the first transistor Mp<1> and the second transistor Mn<1> is within the scope of this disclosure. That is, the design of the adjustable enhancement circuits 146 and 148 may be adjusted by those of ordinary skills in the art.

In addition, though the number of the first optional signals Popt<1>~Popt<Y> illustrated in FIGS. 10A~10B is as the same as the number of second optional signals Nopt<1>~Nopt<Y> illustrated in FIG. 11A~11B (i.e., Y optional signals), in some other embodiments, numbers of the optional signals received by the enhancement components AEDp, AEDn are different. For example, there may be Y1 first optional signals UP_Popt<1>~UP_Popt<Y1> received by the enhancement component AEDp of the adjustable enhancement circuit 146, there may be Y2 second optional signals UP_Nopt<1>~UP_Nopt<Y2> received by the enhancement component AEDn of the adjustable enhancement circuit 146, there may be Y3 first optional signals DN_Popt<1>~DN_Popt<Y3> received by the enhancement component AEDp of the adjustable enhancement circuit 148, and there may be Y4 second optional signals DN_Nopt<1>~DN_Nopt<Y4> received by the enhancement component AEDn of the adjustable enhancement circuit 148, in which Y1, Y2, Y3 and Y4 may be the same, partially different or totally different.

In the foregoing, exemplary operations are included. However, these operations do not need to be performed sequentially. The operations mentioned in the embodiment may be adjusted according to actual needs unless the order is specifically stated, and may even be performed simultaneously or partially simultaneously.

It is noted that, the drawings, the embodiments, and the features and circuits in the various embodiments may be combined with each other as long as no contradiction appears. The circuits illustrated in the drawings are merely examples and simplified for the simplicity and the ease of understanding, but not meant to limit the present disclosure. In addition, those skilled in the art can understand that in various embodiments, circuit units may be implemented by different types of analog or digital circuits or by different chips having integrated circuits. Components may also be integrated in a single chip having integrated circuits. The description above is merely by examples and not meant to limit the present disclosure.

In summary, in various embodiments of the present disclosure, by the adjustable enhancement circuits 146 and 148, the slew rates of rising and dropping the control signals PUP and PDN are able to be higher, so as to improve the slew rates of rising and dropping the output signal OUT1 so that the output data of the output signal OUT1 is able to be clear when the input data Din1 changes. In addition, by adjusting the numbers of the optional signals (e.g., UP_Popt<1>~UP_Popt<Y>, UP_Nopt<1>~UP_Nopt<Y>, DN_Popt<1>~DN_Popt<Y>, DN_Nopt<1>~DN_Nopt<Y>) output by the OCD front-end driving circuit 140, the slew rate of rising and dropping the control signals PUP and PDN can be controlled respectively to meet actual demand.

Although specific embodiments of the disclosure have been disclosed with reference to the above embodiments, these embodiments are not intended to limit the disclosure. Various alterations and modifications may be performed on the disclosure by those of ordinary skills in the art without departing from the principle and spirit of the disclosure. Thus, the protective scope of the disclosure shall be defined by the appended claims.

What is claimed is:

1. An off chip driving circuit, comprising:
   a decision circuit, configured to output a first decision signal and a second decision signal according to a clock and an input data;
   a first compensation circuit, coupled to the decision circuit, configured to generate a first control signal in response to the first decision signal and the second decision signal;
   a second compensation circuit, coupled to the decision circuit, configured to generate a second control signal in response to the first decision signal and the second decision signal;
   a pull-up circuit, configured to be enabled in response to the first control signal; and
   a pull-down circuit, configured to be enabled in response to the second control signal.

2. The off chip driving circuit of claim 1, wherein the decision circuit is configured to generate the first decision signal with a high level when the input data turns from a first level to a second level, and to generate the second decision signal with a low level when the input data turns from the second level to the first level.

3. The off chip driving circuit of claim 1, wherein
   the first compensation circuit comprises a first adjustable enhancement circuit, the first adjustable enhancement circuit comprises:
   a first enhancement component, configured to be conducted according to the second decision signal so as to provide a high voltage as the first control signal; and
   a second enhancement component, configured to be conducted according to the first decision signal so as to provide a low voltage as the first control signal;
   wherein the second compensation circuit comprises a second adjustable enhancement circuit, the second adjustable enhancement circuit comprises:
   a third enhancement component, configured to be conducted according to the second decision signal so as to provide the high voltage as the second control signal; and
   a fourth enhancement component, configured to be conducted according to the first decision signal so as to provide the low voltage as the second control signal.

4. The off chip driving circuit of claim 3, wherein the first compensation circuit further comprises a first pre-driver, the second compensation circuit further comprises a second pre-driver, the first pre-driver and the second pre-driver are CMOS.

5. The off chip driving circuit of claim 3, wherein
   the first enhancement component comprises:
   a first switch, configured to be conducted according to a first enable signal; and
   a first transistor, coupled to the first switch, configured to be conducted in response to the input data;
   wherein the second enhancement component comprises:
   a second switch, configured to be conducted according to a second enable signal; and
   a second transistor, coupled to the second switch, configured to be conducted in response to the input data;
   wherein the third enhancement component comprises:
   a third switch, configured to be conducted according to a third enable signal; and
   a third transistor, coupled to the third switch, configured to be conducted in response to the input data;
   wherein the fourth enhancement component comprises:
   a fourth switch, configured to be conducted according to a fourth enable signal; and
   a fourth transistor, coupled to the fourth switch, configured to be conducted in response to the input data.

6. The off chip driving circuit of claim 5, wherein
   the first enhancement component further comprises:
   a first logic gate, configured to generate the first enable signal according to the second decision signal and a first optional signal to output the first enable signal to the first switch,
   wherein the second enhancement component further comprises:
   a second logic gate, configured to generate the second enable signal according to the first decision signal and a second optional signal to output the second enable signal to the second switch,
   wherein the third enhancement component further comprises:
   a third logic gate, configured to generate the third enable signal according to the second decision signal and a third optional signal to output the third enable signal to the third switch,
   wherein the fourth enhancement component further comprises:
   a fourth logic gate, configured to generate the fourth enable signal according to the first decision signal and a fourth optional signal to output the fourth enable signal to the fourth switch.

7. The off chip driving circuit of claim 5, wherein
   the first enhancement component further comprises:
   a first multiplexer, configured to generate the first enable signal according to the second decision signal and a first optional signal to output the first enable signal to the first switch,
   wherein the second enhancement component further comprises:
   a second multiplexer, configured to generate the second enable signal according to the first decision signal and a second optional signal to output the second enable signal to the second switch,
   wherein the third enhancement component further comprises:

a third multiplexer, configured to generate the third enable signal according to the second decision signal and a third optional signal to output the third enable signal to the third switch, wherein the fourth enhancement component further comprises:

a fourth multiplexer, configured to generate the fourth enable signal according to the first decision signal and a fourth optional signal to output the fourth enable signal to the fourth switch.

8. The off chip driving circuit of claim 5, wherein the first switch and the third switch are PMOS, and the second switch and the fourth switch are NMOS.

9. The off chip driving circuit of claim 5, wherein the first switch and the third switch are NMOS with a NOT gate, and the second switch and the fourth switch are PMOS with a NOT gate.

10. The off chip driving circuit of claim 5, wherein the first switch, the third switch, the second switch and the fourth switch are CMOS.

11. The off chip driving circuit of claim 1, wherein the first compensation circuit comprises a first adjustable enhancement circuit, the first adjustable enhancement circuit comprises:

a plurality of first enhancement components connected in parallel, configured to be conducted according to the second decision signal and a plurality of first optional signals so as to provide a high voltage as the first control signal; and a plurality of second enhancement components connected in parallel, configured to be conducted according to the first decision signal and a plurality of second optional signals so as to provide a low voltage as the first control signal;

wherein the second compensation circuit comprises a second adjustable enhancement circuit, the second adjustable enhancement circuit comprises:

a plurality of third enhancement components connected in parallel, configured to be conducted according to the second decision signal and a plurality of third optional signals so as to provide the high voltage as the second control signal; and a plurality of fourth enhancement components connected in parallel, configured to be conducted according to the first decision signal and a plurality of fourth optional signals so as to provide the low voltage as the second control signal.

12. The off chip driving circuit of claim 11, wherein one of the first enhancement components comprises:

a first switch, configured to be conducted according to a first enable signal; and at least one first transistor, connected to the first switch in series, configured to be conducted in response to the input data;

wherein one of the second enhancement components comprises:

a second switch, configured to be conducted according to a second enable signal; and at least one second transistor, connected to the second switch in series, configured to be conducted in response to the input data;

wherein one of the third enhancement components comprises:

a third switch, configured to be conducted according to a third enable signal; and at least one third transistor, connected to the third switch in series, configured to be conducted in response to the input data;

wherein one of the fourth enhancement components comprises:

a fourth switch, configured to be conducted according to a fourth enable signal; and at least one fourth transistor, connected to the fourth switch in series, configured to be conducted in response to the input data.

13. The off chip driving circuit of claim 11, wherein a first slew rate of the first control signal is according to the number of the first optional signals and the second optional signals, a second slew rate of the second control signal is according to the number of the third optional signals and the fourth optional signals.

14. The off chip driving circuit of claim 11, wherein at least one of the number of the first enhancement components, the number of the second enhancement components, the number of the third enhancement components and the number of the fourth enhancement components is different from each other.

15. A signal compensation method, comprising:

turning a first decision signal to a high level when an input data turns from a first level to a second level;

turning a second decision signal to a low level when the input data turns from the second level to the first level;

generating a first control signal in response to the first decision signal and the second decision signal;

generating a second control signal in response to the first decision signal and the second decision signal;

enabling a pull-up circuit in response to the first control signal; and enabling a pull-down circuit in response to the second control signal.

16. The signal compensation method of claim 15, further comprising:

inducing a high voltage as the first control signal or the second control signal in response to the input data with the first level; and inducing a low voltage as the first control signal or the second control signal in response to the input data with the second level.

17. The signal compensation method of claim 15, further comprising:

conducting a first enhancement component according to the second decision signal so as to provide a high voltage as the first control signal;

conducting a second enhancement component according to the first decision signal so as to provide a low voltage as the first control signal;

conducting a third enhancement component according to the second decision signal so as to provide the high voltage as the second control signal; and conducting a fourth enhancement component according to the first decision signal so as to provide the low voltage as the second control signal.

18. The signal compensation method of claim 17, further comprising:

conducting at least one first switch of a first enhancement component according to at least one first enable signal of the second decision signal so as to provide the high voltage as the first control signal;

conducting at least one second switch of a second enhancement component according to at least one second enable signal of the first decision signal so as to provide the low voltage as the first control signal;

conducting at least one third switch of a third enhancement component according to at least one third enable signal of the second decision signal so as to provide the high voltage as the second control signal; and conducting at least one fourth switch of a fourth enhancement component according to at least one fourth enable signal of the first decision signal so as to provide the low voltage as the second control signal.

19. The signal compensation method of claim 18, further comprising:

generating the at least one first enable signal according to at least one first optional signal;

generating the at least one second enable signal according to at least one second optional signal;

generating the at least one third enable signal according to at least one third optional signal; and generating the at least one fourth enable signal according to at least one fourth optional signal, wherein the number of the first enable signals, the number of the second enable signals, the number of the third enable signals and the number of the fourth enable signals are equal to the first optional signals, the second optional signals, the third optional signals and the fourth optional signals, respectively.

20. The signal compensation method of claim 19, wherein a first slew rate of the first control signal is according to the number of the first optional signals and the second optional signals, a second slew rate of the second control signal is according to the number of the third optional signals and the fourth optional signals.

* * * * *